United States Patent
Hanamura

(10) Patent No.: US 6,501,167 B2
(45) Date of Patent: Dec. 31, 2002

(54) LOW INDUCTANCE POWER WIRING STRUCTURE AND SEMICONDUCTOR DEVICE

(75) Inventor: Akihiro Hanamura, Kanagawa-ken (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/855,605

(22) Filed: May 16, 2001

(65) Prior Publication Data

US 2001/0045639 A1 Nov. 29, 2001

(30) Foreign Application Priority Data

May 25, 2000 (JP) ........................................ 2000-154704

(51) Int. Cl.[7] .............................................. H01L 23/52
(52) U.S. Cl. ...................... 257/691; 257/299; 257/723; 363/16; 363/123; 363/131
(58) Field of Search ................................ 257/691, 723, 257/299; 363/131, 132

(56) References Cited

U.S. PATENT DOCUMENTS

| | | | | |
|---|---|---|---|---|
| 5,499,186 A | * | 3/1996 | Carosa | 363/132 |
| 5,544,035 A | * | 8/1996 | Beriger et al. | 363/132 |
| 5,719,759 A | * | 2/1998 | Wagner et al. | 363/132 |
| 5,808,240 A | * | 9/1998 | Czerwinski et al. | 174/149 B |
| 5,942,797 A | * | 8/1999 | Terasawa | 257/723 |
| 6,181,590 B1 | * | 1/2001 | Yamane et al. | 363/132 |
| 6,255,008 B1 | * | 7/2001 | Iwase | 429/9 |

FOREIGN PATENT DOCUMENTS

JP  02-188189  *  7/1990  ................. 318/811

OTHER PUBLICATIONS

"Intelligent IGBT Module for the Hybrid Vehicle", Y. Nii et al., Society of Automotive Engineers of Japan, Inc., Proceeding of Conference 982, 1998, pp. 61–64 (Month Unknown).

* cited by examiner

Primary Examiner—Hoai Ho
Assistant Examiner—Tu-Tu Ho
(74) Attorney, Agent, or Firm—McDermott, Will & Emery

(57) ABSTRACT

A power wiring structure realizes low inductance and is applicable to a semiconductor device. The power wiring structure employs two switching elements that are connected in series and are complementarily turned on and off. Ends of the switching elements are connected to power lines extending from a power source. A node between the switching elements is connected to an output line U that is connected to load. The power lines are a high-potential power line P and a low-potential power line N. The lines P, N, and U are each a wide electrode with the width thereof greater than the thickness thereof. The electrodes are layered one upon another in a thickness direction in order of P, U, and N to form a three-layer wide electrode structure. A current of the same value as and oppositely oriented from a current flowing through the output line U flows through the power line P or N, to cancel magnetic fields generated by the currents, thereby effectively reducing wiring inductance.

13 Claims, 10 Drawing Sheets

FIG.4A
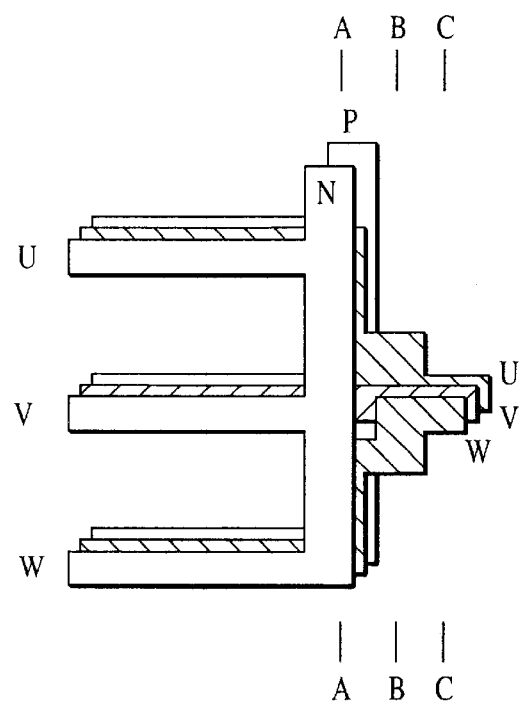
FIG.4B  FIG.4C
FIG.4D
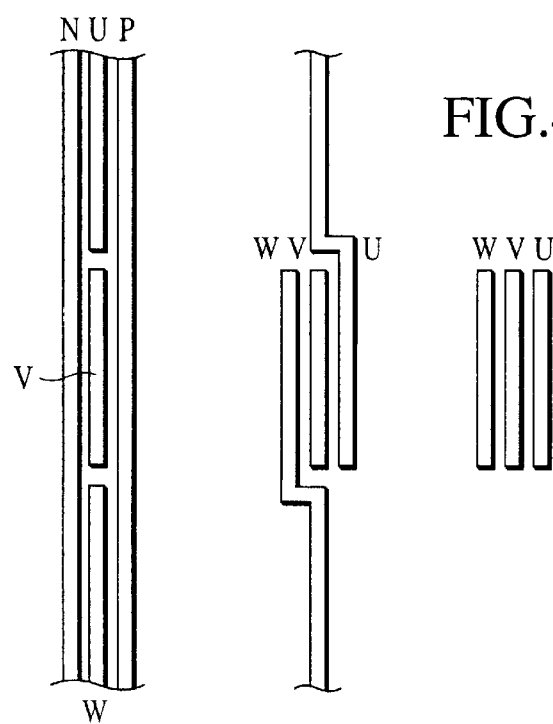

FIG.5A
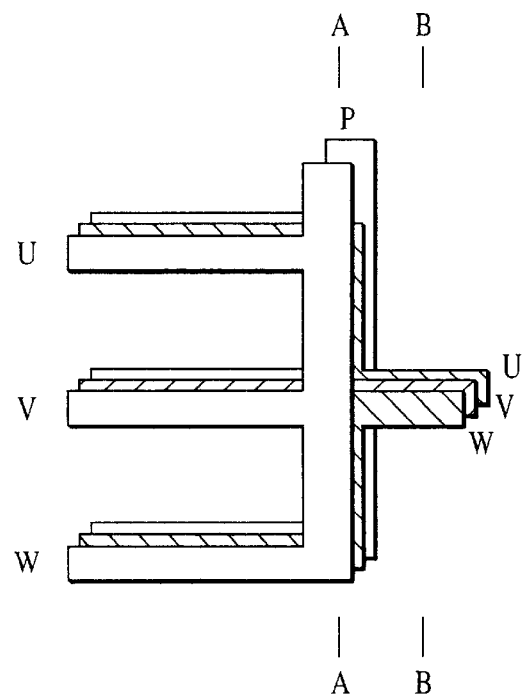
FIG.5B
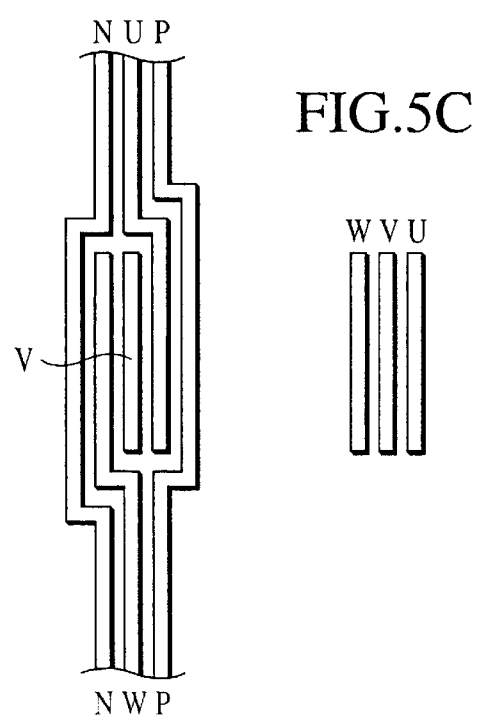
FIG.5C

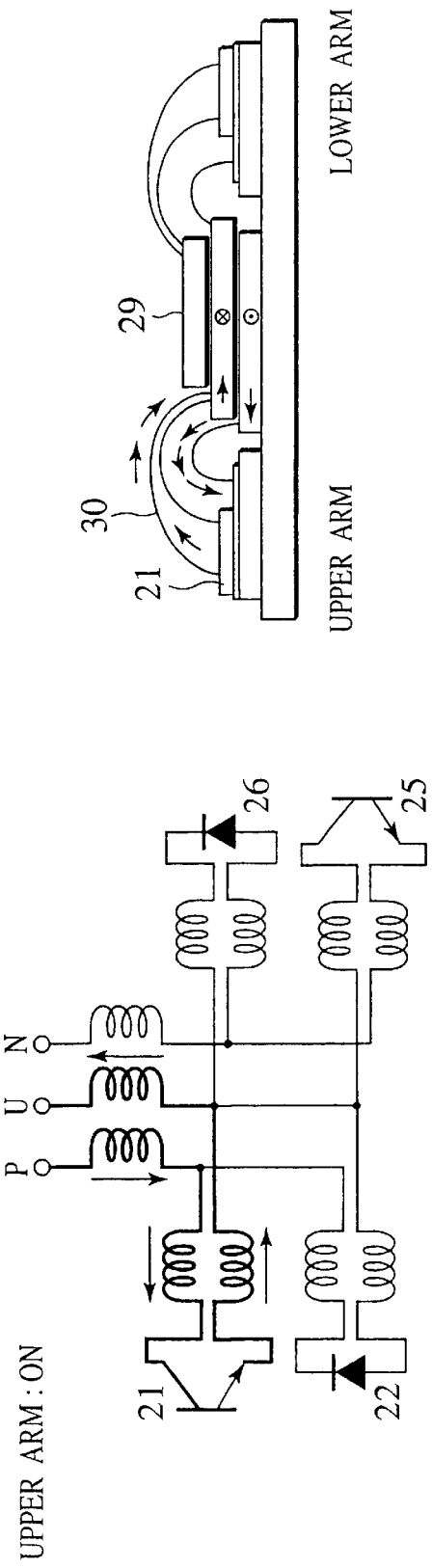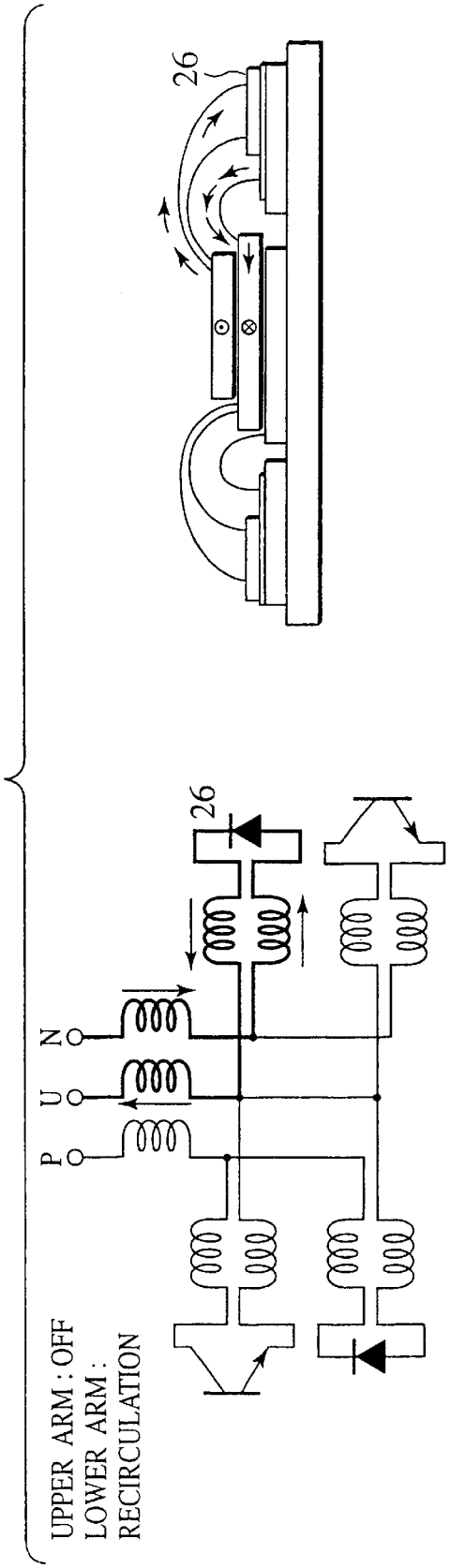
FIG.7A — UPPER ARM: ON
FIG.7B — UPPER ARM: OFF / LOWER ARM: RECIRCULATION

LOWER ARM : ON

LOWER ARM : OFF
UPPER ARM : RECIRCULATION

LOW INDUCTANCE POWER WIRING STRUCTURE AND SEMICONDUCTOR DEVICE

BACKGROUND OF THE INVENTION

1. Field of the Invention

The present invention relates to a low-inductance wiring structure with semiconductor switching elements, applicable to a power inverter.

2. Description of the Related Art

When two wide electrodes are laid one upon another with an insulator interposing between them and currents that are oppositely directed are passed through the electrodes, respectively, magnetic fields produced around the electrodes by the currents cancel each other, to reduce the inductance of the electrodes. This phenomenon is widely known. Based on this phenomenon, Japanese Unexamined Patent Publication No. 6-38507 discloses a technique of layering a high-potential power bus P and a low-potential power bus N to form a two-layer electrode structure capable of reducing inductance.

The two-layer electrode structure involving power buses P and N is applicable to an inverter module having an integrated inverter circuit, to reduce inductance. In practice, however, the two-layer structure does not always pass opposite currents of the same value because the buses P and N in the two-layer structure must supply a current to load through an output line U. In a real inverter module, a current forms a loop as shown in FIG. 1. The inverter module 1 of FIG. 1 involves two phases U and V. In each of U- and V-phase circuits, buses P and N are arranged to face each other with an insulator interposing between them. This configuration forms a current path indicated with a thick black lines and a looped current path indicated with a large dotted arrow mark depicted by C. Namely, opposite currents to cancel magnetic fields flow only in dotted circle areas A and B outside the inverter module 1. Inside the inverter module 1, magnetic fields do not cancel each other. Consequently, the example of FIG. 1 is insufficient to provide the effect of reducing wiring inductance.

When a switching element in an inverter is turned on and off, it generates a surge voltage V=−L·di/dt that is proportional to inductance L. If the inductance of wiring is large, a large surge voltage is produced to break the switching element. To prevent the breakage of switching elements, a snubber may be arranged. The snubber, however, increases the number of parts, to increase the size and cost of the inverter. Instead of employing the snubber, the surge voltage is suppressible by slowing down a switching speed. This, however, hinders high-frequency switching and elongates a switching time to increase switching loss and heat. The heat needs a large radiator to cool and deteriorates efficiency.

SUMMARY OF THE INVENTION

An object of the present invention is to provide a power wiring structure of low inductance.

Another object of the present invention is to provide a semiconductor device employing such a power wiring structure.

In order to accomplish the objects, an aspect of the present invention provides a power wiring structure employing two switching elements connected in series and complementarily turned on and off, power lines extending from a power source to one ends of the switching elements, and an output line extending from a node between the switching elements to load. The power lines include a high-potential power line P and a low-potential power line N. The output line is an output line U. The lines P, N, and U are each a wide electrode with the width thereof being greater than the thickness thereof. These lines are layered one upon another in order of P, U, and N with an insulator interposed between adjacent ones of the layered lines, to form a three-layer wide electrode structure. The two switching elements that are connected in series and are complementarily turned on and off correspond to, for example, an inverter circuit, an H-bridge circuit employing two inverters connected in parallel with each other, and a three-phase inverter circuit employing three inverter circuits connected in parallel with one another.

Assuming that there is no current leakage, opposite currents of the same value flow through the output line U and one of the power lines P and N, to cancel magnetic fields generated around the lines by the currents, thereby effectively reducing wiring inductance.

Another aspect of the present invention employs the three-layer wide electrode structure mentioned above and arranges wiring such as bonding wires in an inverter module in such a way as to cancel magnetic fields generated by currents flowing through the wiring, thereby effectively reducing the inductance of the wiring in the inverter module.

BRIEF DESCRIPTION OF THE DRAWINGS

FIGS. 2A to 2C show a power wiring structure for an inverter according to an embodiment of the present invention, in which FIG. 2A is a circuit diagram, FIG. 2B a perspective view, and FIG. 2C a view showing connections in the wiring structure;

FIGS. 3A and 3B show a power wiring structure for an inverter module with U- and V-phases according to another embodiment of the present invention, in which FIG. 3A is a circuit diagram and FIG. 3B a view showing connections in the wiring structure;

FIGS. 4A–4D shows a power wiring structure according to still another embodiment of the present invention, in which FIG. 4A is a perspective view, FIG. 4B a sectional view taken along a line A—A of FIG. 4A, FIG. 4C a sectional view taken along a line B—B of FIG. 4A, and FIG. 4D a sectional view taken along a line C—C of FIG. 4A:

FIGS. 5A–5C shows a power wiring structure according to still another embodiment of the present invention in which FIG. 5A is a perspective view, FIG. 5B a sectional view taken along a line A—A of FIG. 5A, and FIG. 5C a sectional view taken along a line B—B of FIG. 5A;

FIGS. 6A and 6B show an inverter module according to still another embodiment of the present invention, in which FIG. 6A is a perspective view and FIG. 6B a circuit diagram;

FIGS. 7A to 7D show currents during the operation of the inverter module of FIGS. 6A and 6B, in which FIG. 7A shows a state that a transistor 21 of an upper arm is ON, FIG. 7B a state that the transistor 21 is OFF and a current is circulated through a free wheeling diode 26 of a lower arm, FIG. 7C a state that a transistor 25 of the lower arm is ON, and FIG. 7D a state that the transistor 25 is OFF and a current is circulated through a free wheeling diode 22 of the upper arm;

DESCRIPTION OF THE PREFERRED EMBODIMENT

Power wiring structures according to embodiments of the present invention will be explained. The wiring structures are capable of effectively reducing wiring inductance. Even at high-speed switching, the wiring structures cause no surge voltage that may break switching elements. The wiring structures, therefore, need no snubber, to thereby reduce the size and cost of apparatuses to which the wiring structures are applied. The wiring structures ensure high-speed switching, suppress switching loss, minimize the heating of elements, and improve efficiency. When applied to the internal wiring of inverter modules, the wiring structures effectively reduce the inductance of the internal wiring.

Figure 1:
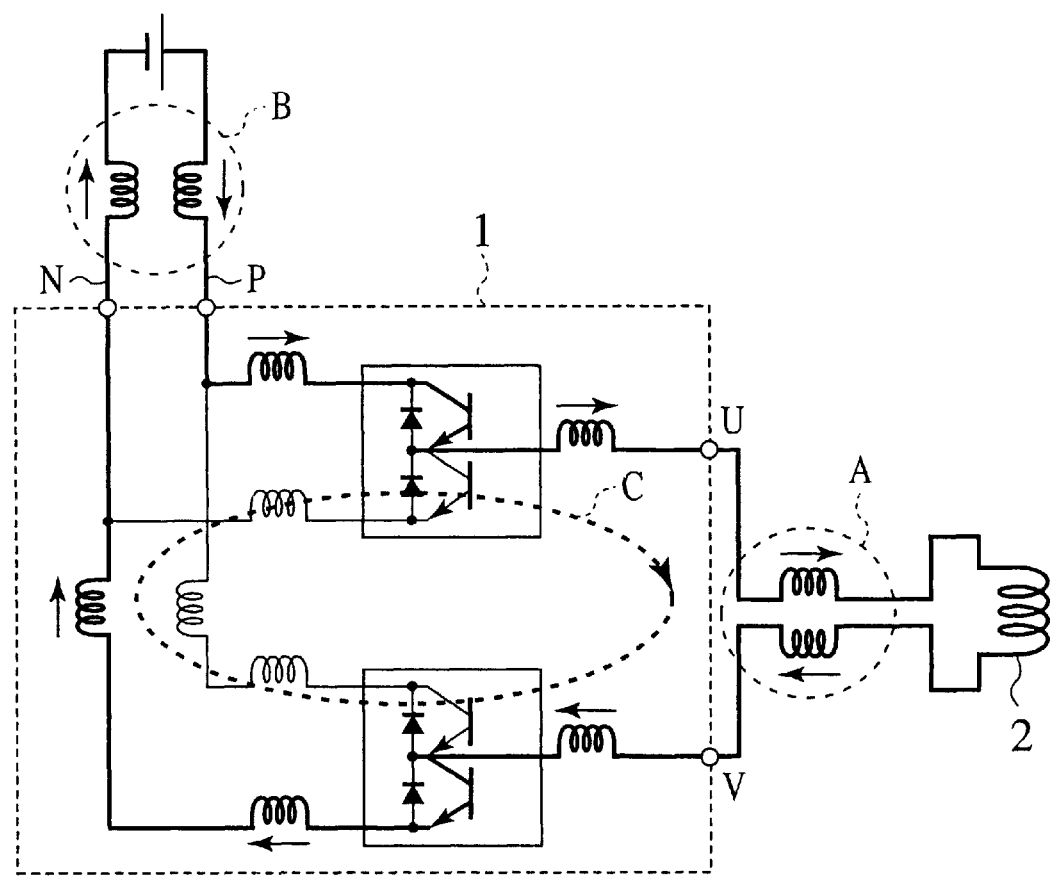
FIG. 1 is a circuit diagram showing a conventional power wiring structure for an inverter.
Figure 2A:
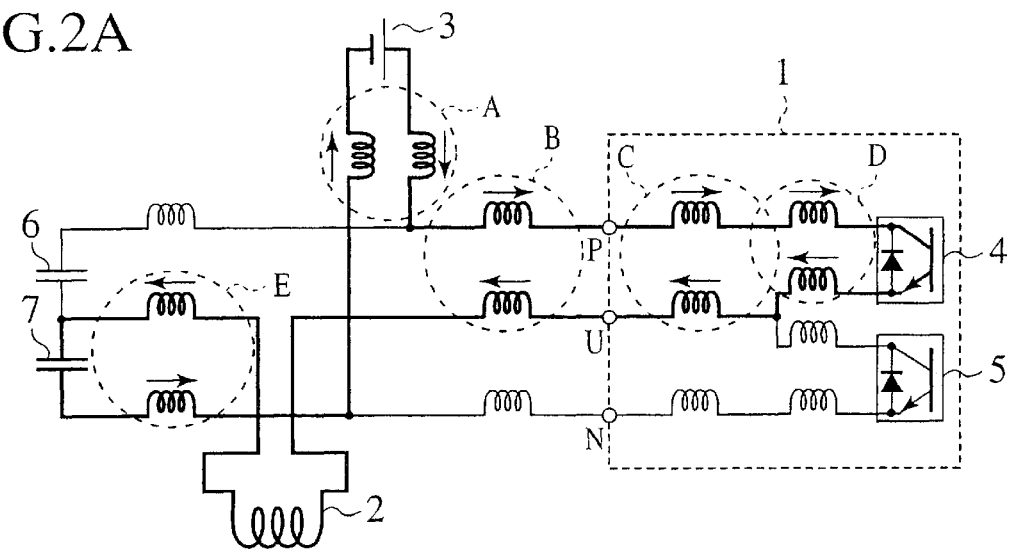
Figure 2B:
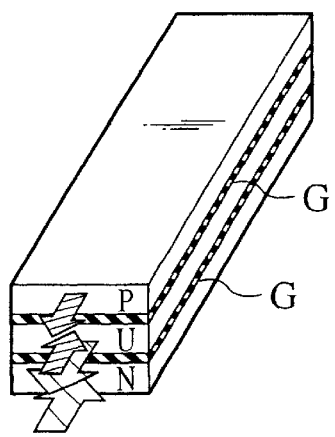
Figure 2C:
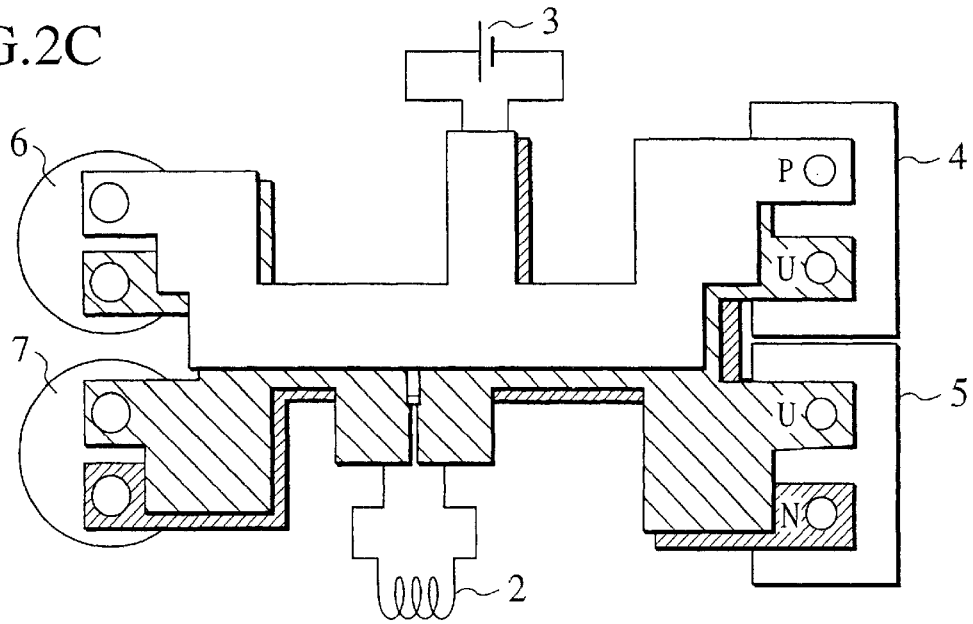

FIGS. 2A to 2C show a power wiring structure according to an embodiment of the present invention, in which FIG. 2A is a circuit diagram, FIG. 2B a perspective view, and FIG. 2C a view showing connections in the wiring structure.

In this embodiment, the wiring structure is applied to a single-phase inverter containing two switching, elements connected in series. The wiring structure covers the inverter module 1, load 2, a power source 3, the switching elements 4 and 5, and smoothing capacitors 6 and 7. In this embodiment, the switching elements 4 and 5 are transistors. The switching elements may be thyristors, or any other switching devices. Each of the switching elements 4 and 5 is connected to a free wheeling diode in parallel.

In FIG. 2A, wires for connecting the components 2 to 7 are depicted with inductance symbols (coils). The wires include a high-potential bus P, a low-potential bus N, and an output line U. The buses P and N and line U are layered one upon another in order of P, U, and N, to form a three-layer structure wherein each interlayer is interposed by a thin insulator layer G. Each of the lines P, N, and U is a wide electrode with the width thereof being greater than the thickness thereof. Namely, the thickness d and width W of each electrode layer have the relationship of d/W<1. Between adjacent ones of the layers, an insulator G is interposed. With the three-layer structure added with the insulator layers, magnetic fields generated around the layers by currents oppositely passed through the layers cancel each other. The electrodes are layered close to each other to minimize an area where magnetic fields do not cancel each other, thereby minimizing magnetic flux generated by currents and electromagnetic waves generated by changes in magnetic flux.

The embodiment maintains the multilayer structure as close to connections or terminals of the structure as possible, as shown in FIG. 2C.

The switching elements 4 and 5 are oppositely turned on and off. For example, if the switching element 4 is ON, the switching element 5 is OFF. If the switching element 4 is ON, a current flows through a path indicated with a thick black line in FIG. 2A that routes through a positive terminal of the power source 3, the switching element 4, the load 2, the smoothing capacitor 7, and a negative terminal of the power source 3 in this order. In each of dotted circle areas A, B, C, D on the current path, the multilayer structure of the embodiment passes opposite currents to cancel magnetic fields produced around the electrode layers. If the switching element 4 is OFF, the switching element 5 is ON to pass a current through a path routing through the positive terminal of the power source 3, the smoothing capacitor 6, the load 2, the switching element 5, and the negative terminal of the power source 3. In this case also, the multilayer structure along the current path passes opposite currents to cancel magnetic fields generated around the electrode layers. This arrangement greatly reduces inductance as well as electromagnetic waves.

Figure 3A:
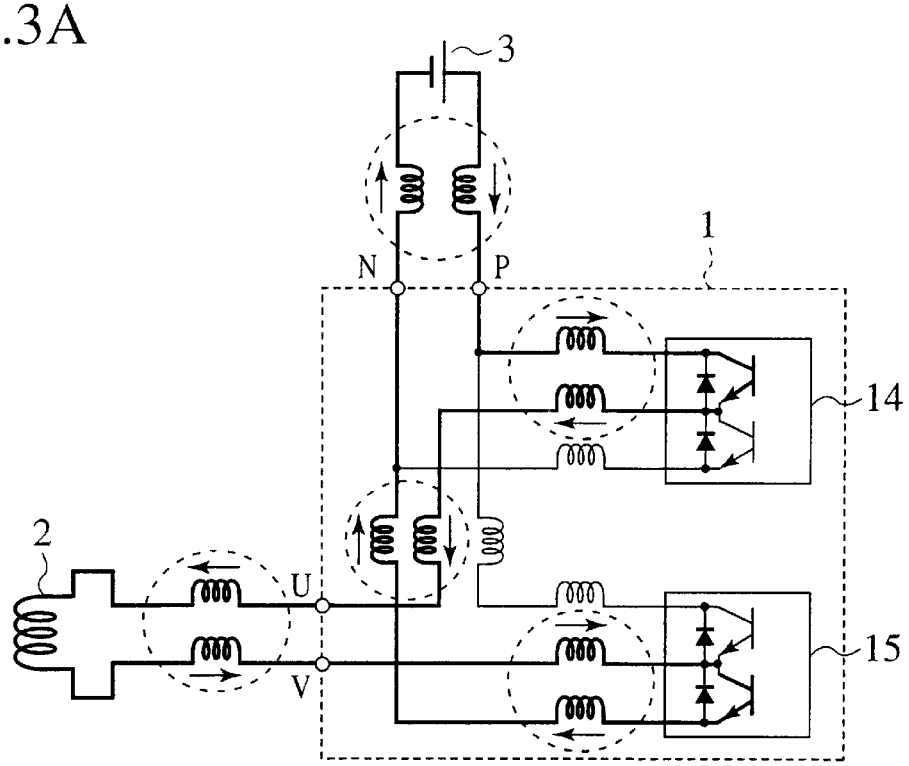
Figure 3B:
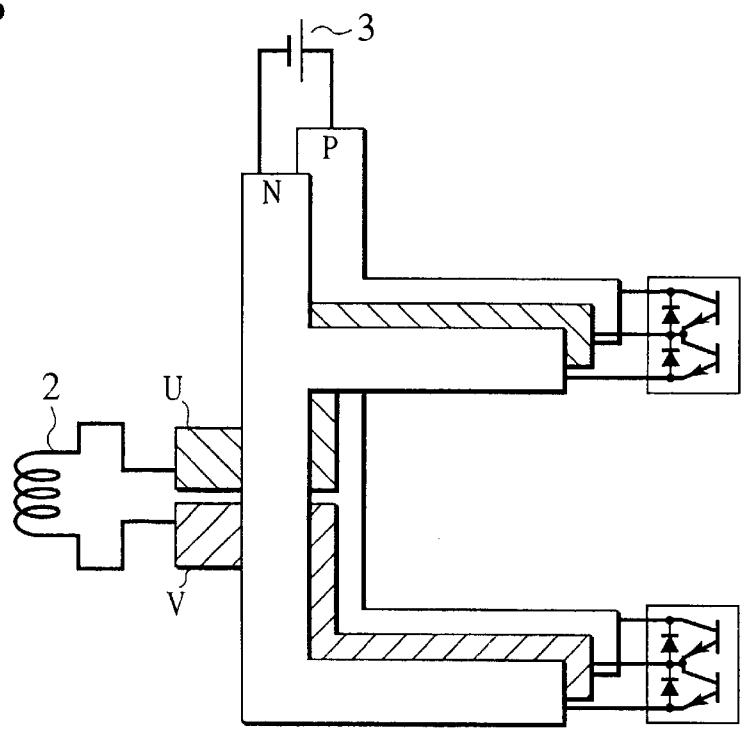

FIGS. 3A and 3B show a power wiring structure for an inverter module with U- and V-phases according to another embodiment of the present invention, in which FIG. 3A is a circuit diagram and FIG. 3B a view showing connections in the wiring structure. The inverter module 1 has switching blocks 14 and 15 each including two switching elements each containing a transistor and a diode connected in parallel with each other. In this embodiment, U- and V-phase lines are wide electrodes sandwiched between buses P and N that are also wide electrodes. Like the embodiment of FIGS. 2A to 2C, the embodiment of FIG. 3A passes opposite currents through each part of the wiring structure, to cancel magnetic fields, thereby greatly reducing inductance. The number of electrode layers in the wiring structure may be three or more.

The above embodiment connects single-phase inverters each employing the three-layer wide electrode structure in parallel with one another to form a multilayer inverter module. The present invention is also applicable to internal electrodes directly connected to switching elements. In this case, electrodes are formed into the multilayer wide electrode structure of FIG. 2B phase by phase, to reduce inductance and electromagnetic waves.

FIGS. 4A–4D shows a power wiring structure according to still another embodiment of the present invention. in which FIG. 4A is a perspective view, FIG. 4B a sectional view taken along a line A—A of FIG. 4A, FIG. 4C a sectional view taken along a line B—B of FIG. 4A, and FIG. 4D a sectional view taken along a line C—C of FIG. 4A. This embodiment relates to, in particular, output leads of the wiring structure.

The wiring structure of FIGS. 4A–4D is applicable to an inverter with U-, V-, and W-phases. In FIG. 4A, U-, V-, and W-phase output lines are each sandwiched between power buses P and N with an insulator layer being interposed between the adjacent bus and output line. In FIG. 4B, the U-, V-, and W-phase output lines are arranged side by side. In FIG. 4C, the U- and W-phase output lines are bent and gathered on and under the V-phase output line. In FIG. 4D, the U-, V-, and W-phase output lines are laid one upon another to form output leads. In this way, the U-, V-, and W-phase output lines are laid one upon another just after they are taken out from between the buses P and N. The thickness of the three-layer wide electrode structure is substantially equal to the thickness of three electrode plates, where the thickness also includes that of the interposed thin insulator layers. This three-layer structure is simple and is easy to fabricate. The U-, V-, and W-phase output lines stacked one upon another as shown in FIGS. 4C and 4D are insulated from one another.

At positions where the U-, V-, and W-phase output lines are taken out from between the buses P and N, they become discrete not to reduce inductance. Around such positions, there will be no current that opposes a current flowing through the buses P and N, assuming that a current flows along the center line of each wiring electrode. This is because the center lines of the U-, V-, and W-phase output lines are spaced apart from one another around such positions. Consequently, the inductance of the buses P and N is not reduced at the positions.

This problem is solved by a wiring structure of FIGS. 5A and 5B according to still another embodiment of the present invention, in which FIG. 5A is a perspective view, FIG. 5B a sectional view taken along a line A—A of FIG. 5A, and FIG. 5C a sectional view taken along a line B—B of FIG. 5A.

In FIG. 5B, U- and W-phase output lines on each side of a V-phase output line are laid on and under the V-phase output line between buses P and N with an insulating layer being interposed between adjacent ones of the lines. The layered U-, V-, and W-phase output lines are taken out from between the buses P and N. This configuration forms no discrete output line, and therefore, surely reduces the inductance of the output lines. In addition, this arrangement stacks the U-, V-, and W-phase output lines one upon another between the buses P and N, to pass opposing currents between the buses P and N and the output lines at a position where the output lines are taken out from between the buses P and N, thereby effectively reducing the inductance of the buses P and N at the position.

Figure 6A:
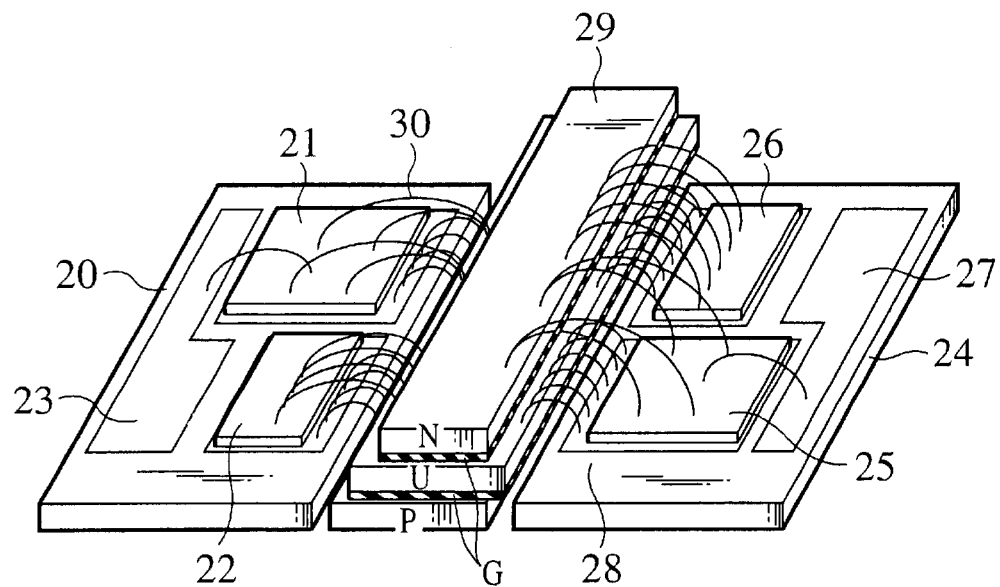

An internal structure of an inverter module according to still another embodiment of the present invention will be explained with reference to FIGS. 6A and 6B in which FIG. 6A is a perspective view and FIG. 6B a circuit diagram. This embodiment corresponds to the single-phase inverter embodiment of FIG. 2.

Figure 6B:
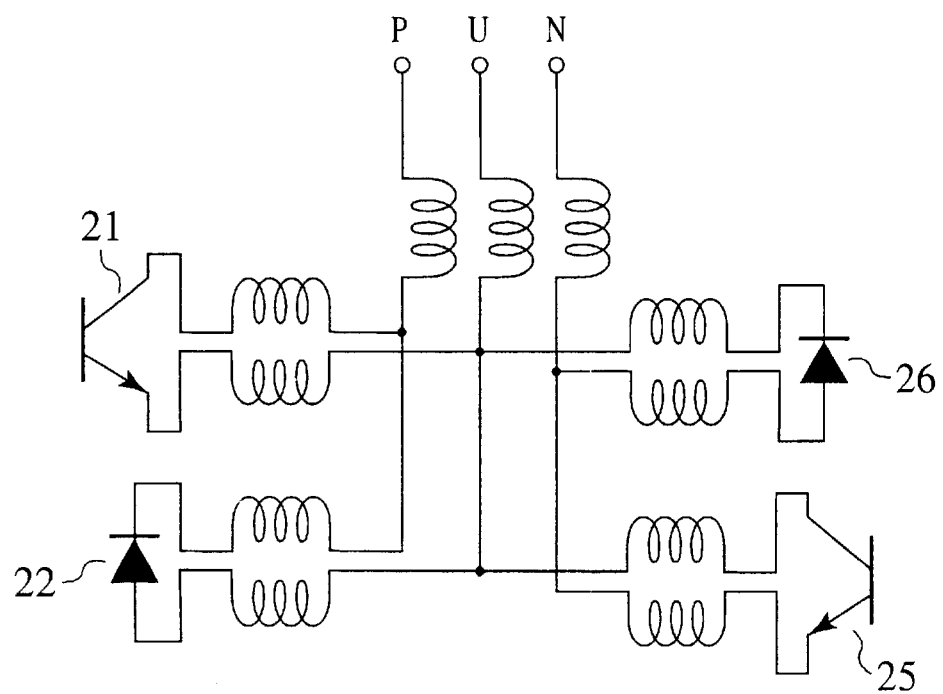

In FIGS. 6A and 6B, an insulating substrate 20, a switching transistor 21, a free wheeling diode 22, and a conductive film 23 for connecting a signal line for the gate of the transistor 21 form a switching element (corresponding to the switching element 4 of FIG. 2A) on an upper arm. Similarly, an insulating substrate 24, a transistor 25, a free wheeling diode 26, and a conductive film 27 form a switching element (corresponding to the switching element 5 of FIG. 2A) on a lower arm. The switching elements on the upper and lower arms are arranged on each side of a three-layer wide electrode structure 29. The transistors 21 and 25 and free wheeling diodes 22 and 26 are formed on conductive films 28, respectively, with bottom electrodes of these elements 21, 25, 22, and 26 connected to the conductive films, respectively. Top electrodes of the elements 21, 25, 22 and 26 are connected to the electrode structure 29 through bonding wires 30. Similarly, the conductive films 28 are connected to the electrode structure 29 through bonding wires 30. In FIGS. 6A and 6B, the high-potential side i.e. the bottom electrode of the upper arm is connected to an electrode P of the electrode structure 29 through the bonding wires, the low-potential side i.e. the top electrode of the upper arm is connected to an electrode U of the electrode structure 29, the high-potential side of the lower arm is connected to the electrode U, and the low-potential side of the lower arm is connected to an electrode N of the electrode structure 29.

When the transistors and free wheeling diodes are arranged side by side on each side of the three-layer wide electrode structure 29 as shown in FIGS. 6A and 6B, the conductive films for the transistor and free wheeling diode on each insulating substrate (20, 24) must be separated from each other and must separately be connected to the electrode structure 29 through bonding wires. The transistor 21 and free wheeling diode 22 of the upper arm face the free wheeling diode 26 and transistor 25 of the lower arm with the electrode structure 29 interposing between them.

Input and output currents flowing through the transistors and free wheeling diodes are oppositely oriented to reduce inductance. The transistors and free wheeling diodes of the upper and lower arms are opposed to each other, so that, as soon as one transistor turns off, transient induced current circulates through the opposite free wheeling diode. This arrangement shortens wire lengths to reduce inductance.

Figure 7C:
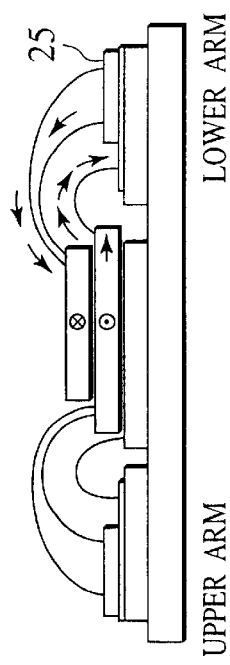
Figure 7C:
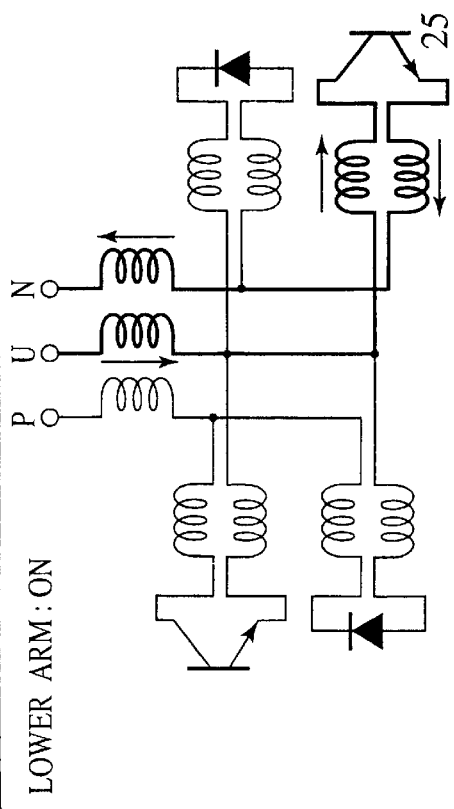
Figure 7D:
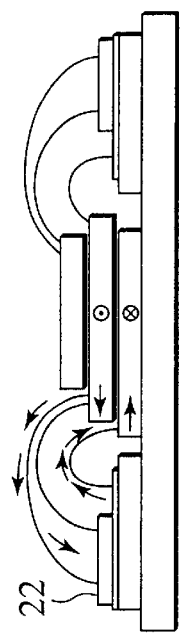
Figure 7D:
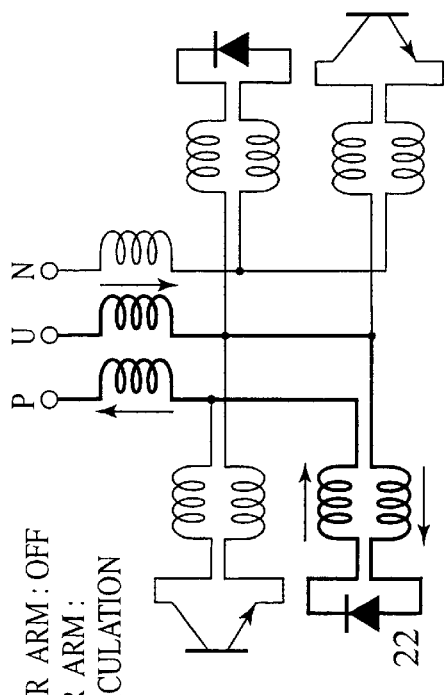

FIGS. 7A to 7D show current flows during the operation of the inverter module of FIGS. 6A and 6B. In each of FIGS. 7A to 7D, a left half is a circuit diagram and a right half a sectional view. FIG. 7A shows a state that the transistor 21 of the upper arm is ON, FIG. 7B a state that the transistor 21 is OFF to pass transient induced current through the free wheeling diode 26 of the lower arm, FIG. 7C a state that the transistor 25 of the lower arm is ON, and FIG. 7D a state that the transistor 25 is OFF to pass transient current through the free wheeling diode 22 of the upper arm.

In FIGS. 7A to 7D, input and output currents oppositely pass through the three-layer wide electrode structure 29 and bonding wires 30 as indicated with arrow marks, to effectively cancel magnetic fields, thereby greatly reducing inductance and electromagnetic waves.

Figure 8A:
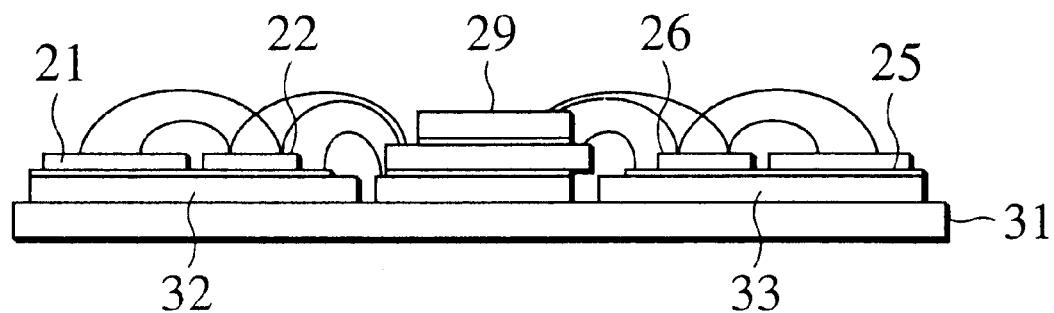
FIGS. 8A and 8B are sectional views showing other arrangements of the transistors and free wheeling diodes of FIG. 6A.
Figure 8B:
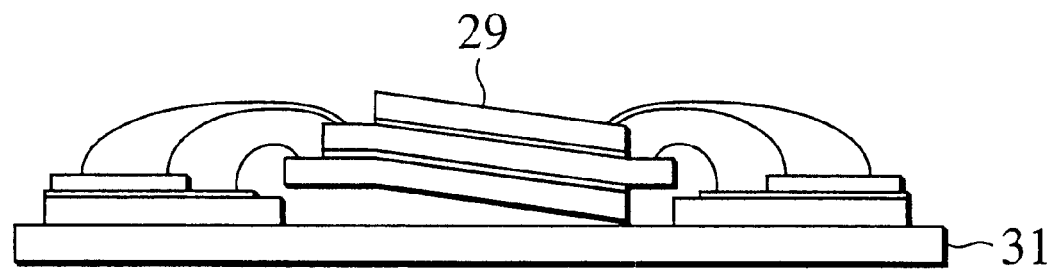

FIGS. 8A and 8B are sectional views showing different arrangements of the transistors and free wheeling diodes of the inverter module of FIG. 6A. In FIG. 8A, the free wheeling diodes 22 and 26 are arranged close to the three-layer wide electrode structure 29 on each side of the electrode structure 29, and the transistors 21 and 25 are arranged on the outer sides of the free wheeling diodes 22 and 26, respectively. Namely, the free wheeling diodes and transistors are arranged on each side of the electrode structure 29 along a line that is orthogonal to the longitudinal axis of the electrode structure 29. In this case, a metal film 32 on an insulating substrate 31 serves for both the transistor 21 and free wheeling diode 22, and a metal film 33 on the insulating substrate 31 serves for both the transistor 25 and free wheeling diode 26, to share bonding wires to the electrode structure 29. This simplifies the fabrication of the inverter module. The transistors and free wheeling diodes on the upper and lower arms face each other, to reduce inductance like the embodiment of FIGS. 6A and 6B.

In FIG. 8B, the three-layer wide electrode structure 29 is inclined to equalize the heights of connection points between the upper and lower arms. This arrangement equalizes wiring lengths between the upper and lower arms to equalize inductance between them. This equalizes surge voltages between the upper and lower arms and balances electric characteristics between them. In FIG. 8B, the transistors and free wheeling diodes are roughly depicted. They may be arranged like FIG. 8A or FIG. 6A.

Figure 9A:
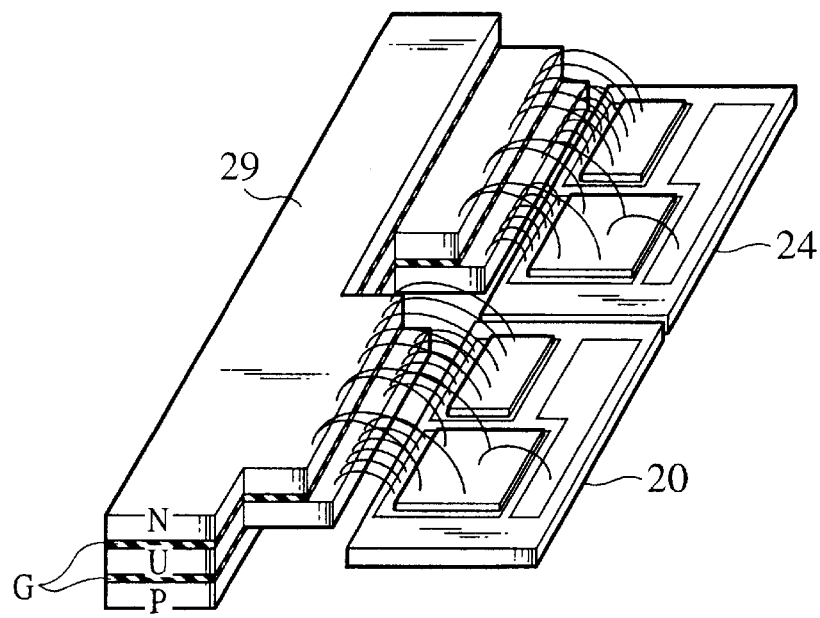
FIGS. 9A and 9B are perspective views showing other arrangements of the upper and lower arms of FIG. 6A.
Figure 9B:
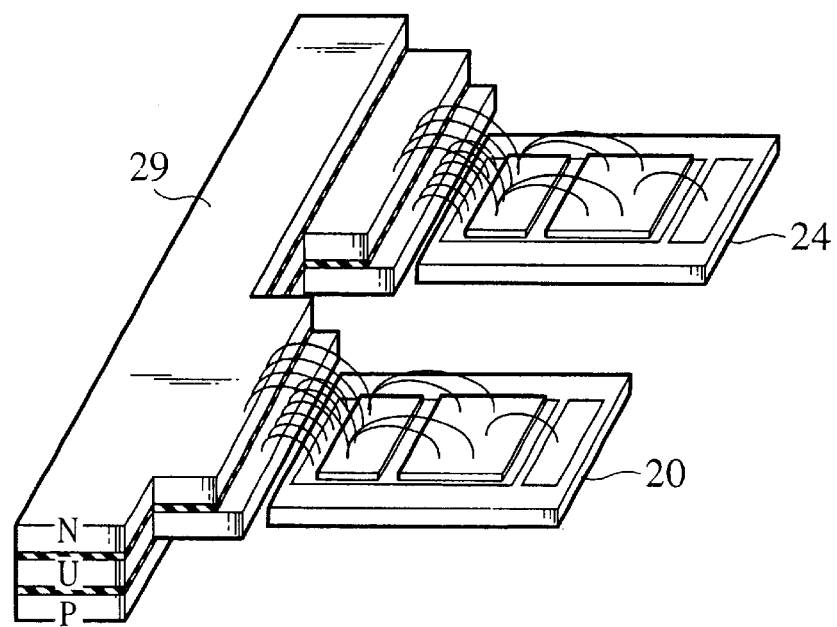

FIGS. 9A and 9B are perspective views showing other arrangements of the upper and lower arms of FIG. 6A. The upper and lower arms are arranged side by side on one side of the three-layer wide electrode structure 29. In FIG. 9A, the transistors and free wheeling diodes are arranged substantially in parallel with the length of the electrode structure 29, like FIG. 6A. In FIG. 9B, the free wheeling diodes and transistors are arranged along lines that are orthogonal to the length of the electrode structure 29, like FIG. 8A.

The embodiments of FIGS. 9A and 9B collectively arrange the semiconductor elements, to make the fabrication thereof easier. Like the embodiment of FIG. 6A, the embodiment of FIG. 9A shortens transistor wiring, to reduce inductance. Like the embodiment of FIG. 8A, the embodiment of FIG. 9B shares bonding wires for conductive films on each substrate, to make the fabrication of the inverter module easier.

Although some embodiments mentioned above employ separate insulating substrates for upper and lower arms, any one of the embodiments may employ a common insulating substrate for upper and lower arms.

This application claims benefit of priority under 35USC §119 to Japanese Patent Applications No. 2000-154704, filed on May 15, 2000, the entire contents of which are incorporated by reference herein.

What is claimed is:

1. A power wiring structure comprising a circuit containing a first power line, a second power line, and an output line to a load, the first power line being connected to a high-potential power source, the second power line being connected to a low-potential power source, the circuit being connected to first and second switching elements that are connected in series and are complementarily turned on and off, and a node between the first and second switching elements being connected to the output line, wherein:

the first power line, the second power line, and the output line are each a wide electrode with the width thereof greater than the thickness thereof; and the first power line, the second power line, and the output line are layered one upon another in a thickness direction in order of the first power line, the output line, and the second power line with an insulator interposed between adjacent ones of the layered lines.

2. The power wiring structure of claim 1, wherein:

the output line includes a plurality of lines of different phases, output ends of these lines being collected and layered one upon another between the first and the second power lines.

3. A semiconductor device comprising:

a power wiring structure including a first power line, a second power line, and an output line, these lines being each a wide electrode with the width thereof greater than the thickness thereof and being layered one upon another in order of the first power line, the output line, and the second power line with an insulator interposed between adjacent ones of the layered lines;

a first conductive layer selectively formed on a first insulating substrate;

a first semiconductor chip formed on the first conductive layer, having a bottom electrode electrically connected to the first conductive layer;

a second conductive layer selectively formed on a second insulating substrate;

a second semiconductor chip formed on the second conductive layer, having a bottom electrode electrically connected to the second conductive layer, and the first semiconductor chip and the second semiconductor chip operating substantially alternately;

means for electrically connecting the first conductive layer to the first power line;

means for electrically connecting a top electrode of the first semiconductor chip to the output line;

means for electrically connecting a top electrode of the second semiconductor chip to the second power line; and means for electrically connecting the second conductive layer to the output line.

4. The semiconductor device of claim 3, wherein:

the first and the second insulating substrates are arranged on each side of the power wiring structure.

5. The semiconductor device of claim 3, wherein:

the first and the second insulating substrates are arranged on each side of the power wiring structure; and the power wiring structure is inclined to substantially equalize the heights of wiring connection points between the first and second insulating substrates.

6. The semiconductor device of claim 3, wherein:

the first and the second insulating substrates are arranged side by side on one side of the power wiring structure along the length of the power wiring structure.

7. The semiconductor device of any one of claims 3 to 6, wherein:

the first semiconductor chip includes a first switching element and a first free wheeling diode;

the second semiconductor chip includes a second switching element and a second free wheeling diode;

the first switching element and the first free wheeling diode are arranged side by side along the length of the power wiring structure;

the second switching element and the second free wheeling diode are arranged side by side along the length of the power wiring structure; and the conductive layer for each semiconductor chip is separated into two, one for a bottom electrode of each switching element and another for a bottom electrode of each free wheeling diode.

8. The semiconductor device of any one of claims 3 to 6, wherein:

each of the semiconductor chips includes a switching element and a free wheeling diode; and the switching element and the free wheeling diode are arranged along a line that is orthogonal to the length of the power wiring structure.

9. The semiconductor device of any one of claims 3 to 6, wherein the electrically connecting means are bonding wires.

10. The semiconductor device of claim 9, wherein the bonding wires connected to the bottom electrode of any one of the semiconductor chips and the bonding wires connected to the top of the semiconductor chip extend in the same direction.

11. The semiconductor device of any one of claims 3 to 6, wherein the first and second insulating substrates are integrated into a common substrate.

12. The semiconductor device of claim 7, wherein the electrically connecting means are bonding wires.

13. The semiconductor device of claim 8, wherein the electrically connecting means are bonding wires.

* * * * *